(12) United States Patent
Chakradhar et al.

(10) Patent No.: US 6,345,373 B1
(45) Date of Patent: Feb. 5, 2002

(54) SYSTEM AND METHOD FOR TESTING HIGH SPEED VLSI DEVICES USING SLOWER TESTERS

(75) Inventors: Srimat T. Chakradhar, Old Bridge, NJ (US); Angela Krstic, San Diego; Kwang-Ting Cheng, Santa Barbara, both of CA (US)

(73) Assignees: The University of California, Santa Barbara, CA (US); NEC USA. Inc., Princeton, NJ (US)

( * ) Notice: Subject to any disclaimer, the term of this patent is extended or adjusted under 35 U.S.C. 154(b) by 0 days.

(21) Appl. No.: 09/296,267

(22) Filed: Apr. 22, 1999

Related U.S. Application Data

(60) Provisional application No. 60/126,783, filed on Mar. 29, 1999.

(51) Int. Cl.$^7$ .......................... G06F 11/00; G01R 31/28
(52) U.S. Cl. ....................... 714/738; 714/724
(58) Field of Search ................. 714/738, 744, 714/739, 742, 724, 733, 734, 798, 811, 815, 741, 32; 324/763, 765, 500, 522, 523, 527, 535

(56) References Cited

U.S. PATENT DOCUMENTS

| | | | | |
|---|---|---|---|---|
| 5,583,787 A | * | 12/1996 | Underwood et al. | ... 395/500.07 |
| 5,606,567 A | * | 2/1997 | Agrawal et al. | ............ 714/732 |
| 6,092,225 A | * | 7/2000 | Gruodis et al. | ............. 714/724 |
| 6,195,772 B1 | * | 2/2001 | Mielke et al. | |

* cited by examiner

*Primary Examiner*—Christine T. Tu
(74) *Attorney, Agent, or Firm*—Sughrue Mion, PLLC

(57) ABSTRACT

At-speed strategies for testing high speed designs on slower testers. At-speed testing schemes is provided that integrates the tester's speed limitations with the test generation process. Due to constraints placed at the test generation process, these schemes might result in a reduced fault coverage. To increase the fault coverage and reduce the test application time, the slow-fast-slow and at-speed strategies can be combined for testing high speed designs on slower testers. A slow tester that uses test vectors that are generated while taking into account the speed of the tester.

7 Claims, 7 Drawing Sheets

FIG. 7
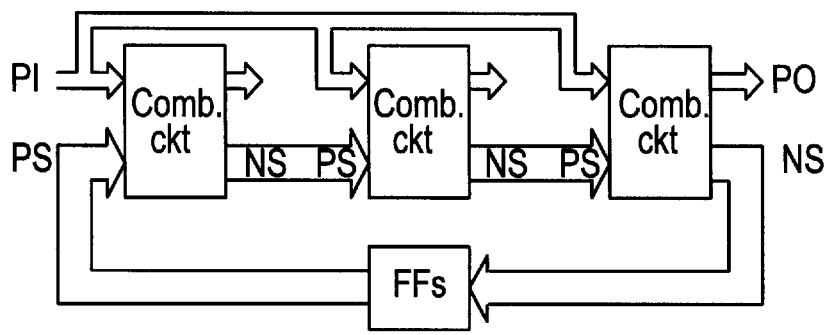
(a)
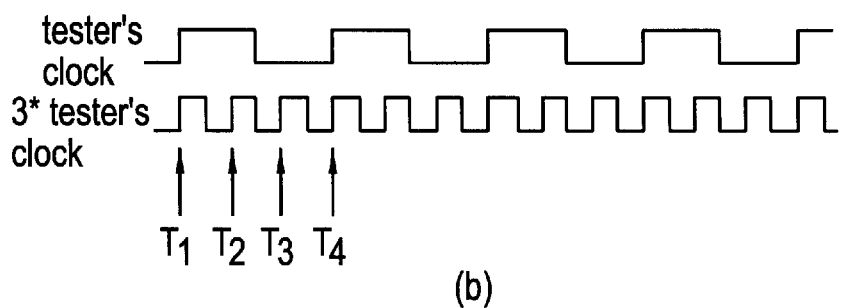
(b)
FIG. 8
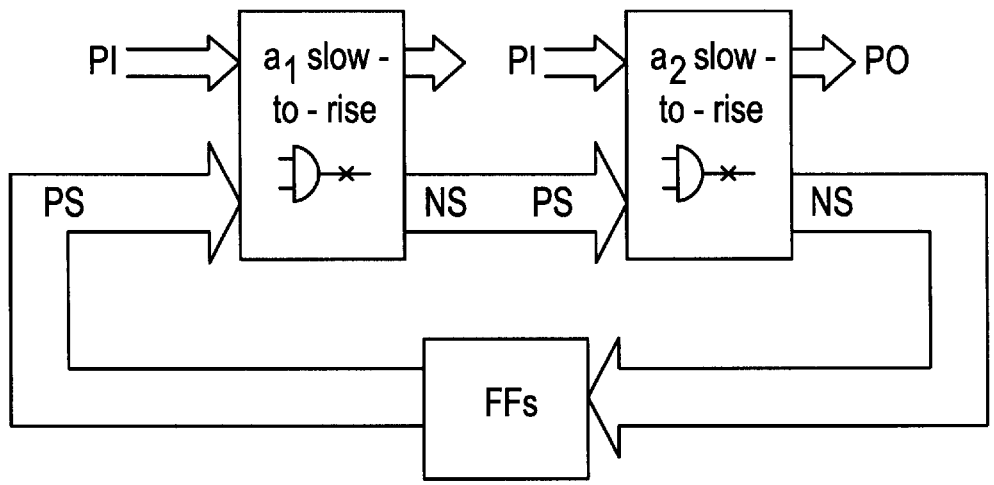

FIG. 9
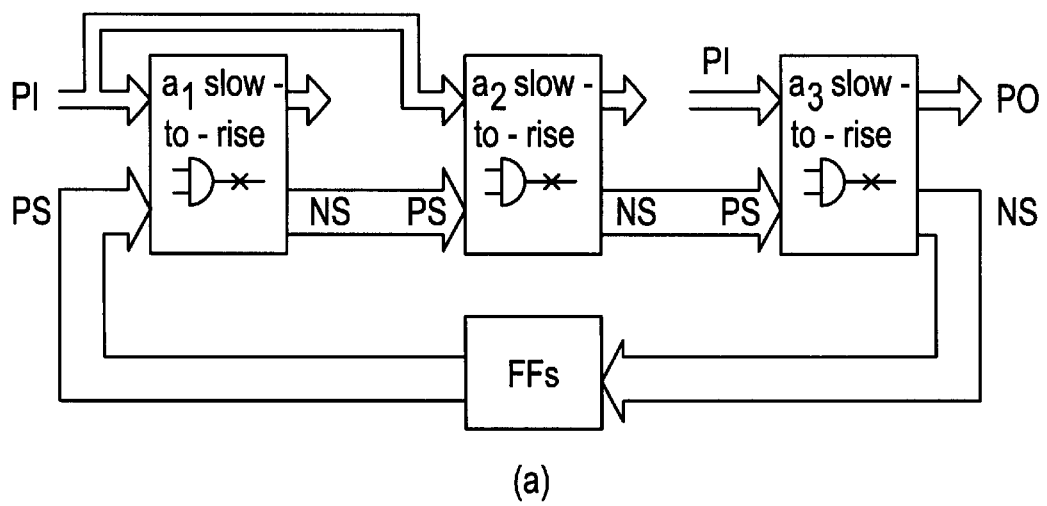
(a)
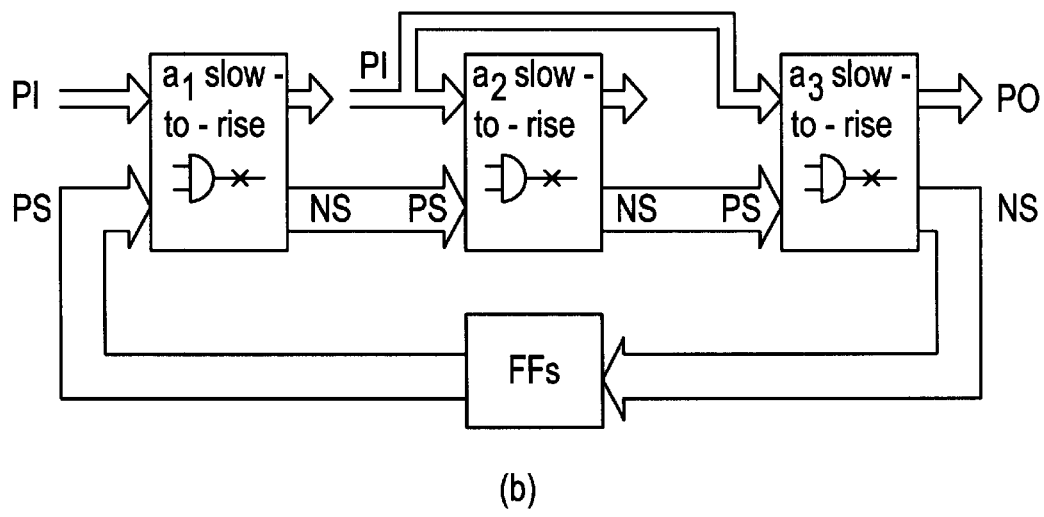
(b)

FIG. 11

| Ckt | κ = 1 fault cov (%) | num of vec | κ = 2 fault cov (%) | num of vec | κ = 3 fault cov (%) | num of vec |
|---|---|---|---|---|---|---|
| s382  | 98.4  | 219 | 95.0  | 484  | 88.3  | 812  |
| s386  | 99.9  | 246 | 99.9  | 741  | 99.9  | 655  |
| s499  | 99.9  | 374 | 99.9  | 1025 | 99.9  | 813  |
| s510  | 100.0 | 281 | 100.0 | 934  | 100.0 | 573  |
| s820  | 100.0 | 581 | 99.9  | 1797 | 99.9  | 1523 |
| s832  | 98.9  | 564 | 98.4  | 1800 | 98.1  | 1807 |
| s967  | 99.8  | 466 | 98.2  | 990  | 92.4  | 1031 |
| s1196 | 98.8  | 753 | 97.7  | 1581 | 91.3  | 1797 |
| s1238 | 96.2  | 820 | 95.7  | 1615 | 88.4  | 1886 |

SYSTEM AND METHOD FOR TESTING HIGH SPEED VLSI DEVICES USING SLOWER TESTERS

I. DESCRIPTION OF THE INVENTION

This application claims priority from U.S. Provisional Application Serial No. 60/126,783, filed on Mar. 29,1999, which is incorporated herein by reference.

IA. FIELD OF THE INVENTION

The present invention relates to testing systems, including testing of VLSI circuits. Specifically, the present invention relates to testing high-speed systems (including testing of high-speed VLSI circuit) using testers that are slower than the high-speed systems (VLSI circuits) that are tested. The present invention is embodied in a method for generating vectors to be used in a slow tester; in a method for testing VLSI devices using a slow tester; and a system for testing VLSI circuits comprising a slow tester.

IB. BACKGROUND OF THE INVENTION

It should be noted that the background description and the preferred embodiments are described with reference to VLSI circuits. However, it should be clear to a skilled artisan that the system and methods of the present invention can be used for testing in a system using a tester that operates at a speed no more than the speed of the system.

The operating speed of VLSI circuits is continuously increasing. Even small delay faults can cause VLSI circuits to malfunction. The temporal correctness of a circuit design can be ensured by subjecting the circuit to delay testing. To detect timing defects and test the performance of the circuit, pre-generated test vectors are applied to the circuit. These delay-testing vectors need to be applied to the circuit during a test at the circuit's intended operating speed. However, testers that are currently used in testing VLSI circuits are usually several times slower than the speed of the new VLSI designs.

As can be readily seen, a gap exists between the speed of the VLSI circuit to be tested and the speed of the tester used test the VLSI circuit. However, purchasing high-speed testers that operate at the speed of the new VLSI designs is expensive. The above-mentioned gap between the speed of the testers and high performance designs is unlikely to disappear in the foreseeable future. Therefore, it is important to find ways to test fast VLSI designs on slower testers.

The problem of testing high-speed circuits without high-speed testers has been discussed in conventional literature. See K. D. Wagner and E. J. McCluskey. Effect of Supply Voltage on Circuit Propagation Delay and Test Application. *Proc. of ICCAD*, pages 42–44, November 1985; S. Barton. Characterization of High-Speed (Above 500 MHz) Devices using Advanced ATE—Technique, Results and Device Problems. *Proc. of ITC*, pages 860–868, October 1989; L. Ackner and M. R. Barber. Frequency Enhancement of Digital VLSI Test Systems. *Proc. of ITC*, pages 444–451, October 1990; D. C. Keezer. Multiplexing Test System Channels for Data Rates Above 1 Gb/s. *Proc. of ITC*, pages 790–797, October 1990; H. Hao and E. J. McCluskey. Very Low Voltage Testing for Weak CMOS Logic ICs. *Proc. of ITC*, pages 275–284, October 1993; V. D. Agrawal, C.-J. Lin, P. W. Rutkowski, S. Wu, and Y. Zorian. Built-In Self-Test for Digital Integrated Circuits. AT~3T *Technical Journal*, 73:30–39, March 1994; J. A. Gasbarro and M. A. Horowitz. Techniques for Characterizing DRAMS with a 500 MHz Interface. *Proc. of ITC*, pages 516–525, October 1994; V. D. Agrawal and T. J. Chakraborty. High-Performance Circuit Testing with Slow-Speed Testers. *Proc. of ITC*, pages 302–310, October 1995; and D. Heidel et al. High Speed Serializing/De-Serializing Design-for-Test Method for evaluating a 1 GHz Microprocessor. *Proc. of ITC*, pages 234–238, October 1998.

Conventional strategies for testing high-speed VLSI circuits include:

tester pin multiplexing. See L. Ackner and M. R. Barber. Frequency Enhancement of Digital VLSI Test Systems. *Proc. of ITC*, pages 444–451, October 1990;

built-in self-test See V. D. Agrawal, C.-J. Lin, P. W. Rutkowski, S. Wu, and Y. Zorian. Built-In Self-Test for Digital Integrated Circuits. AT~3T Technical Journal, 73:30–39, March 1994;

use of a high-speed clock and shift registers. See D. C. Keezer. Multiplexing Test System Channels for Data Rates Above 1 Gb/s. *Proc. of ITC*, pages 790–797, October 1990;

use of special test fixtures. See S. Barton. Characterization of High-Speed (Above 500 MHz) Devices using Advanced ATE—Technique, Results and Device Problems. *Proc. of ITC*, pages 860–868, October 1989;

reducing the supply voltage. See K. D. Wagner and E. J. McCluskey. Effect of Supply Voltage on Circuit Propagation Delay and Test Application. *Proc. of ICCAD*, pages 42–44, November 1985 and See H. Hao and E. J. McCluskey. Very Low Voltage Testing for Weak CMOS Logic ICs. *Proc. of ITC*, pages 275–284, October 1993;

use of on-chip test circuitry for testing high bandwidth memories. See J. A. Gasbarro and M. A. Horowitz. Techniques for Characterizing DRAMS with a 500 MHz Interface. *Proc. of ITC*, pages 516–525, October 1994;

adding extra logic;. See V. D. Agrawal and T. J. Chakraborty. High-Performance Circuit Testing with Slow-Speed Testers. *Proc. of ITC*, pages 302–310, October 1995; and serializing parallel circuit inputs and de-serializing circuit outputs. See D. Heidel et al. High Speed Serializing/De-Serializing Design-for-Test Method for evaluating a 1 GHz Microprocessor. *Proc. of ITC*, pages 234–238, October 1998.

Faults that result in a circuit not producing the correct functional results are called stuck-at faults. Faults that lead to increased delay in generating results are called delay faults. A series of vectors are applied in one or more clock cycles to get a circuit to a stage where it may generate a specific fault. A vector set is applied at one clock cycle after the initialization stage in an activation stage to actually generate the fault. The fault that may show up at a flip-flop or at one of the primary outputs is then transmitted out to be observed during a fault propagation stage, which may require one or more clock cycles and vectors.

Unlike conventional stuck-at fault test generation, test generation for delay faults is closely tied to the test application strategy. Therefore, prior to generating test vectors for delay faults, how the test vectors should be applied to the circuit needs to be determined. Two commonly used testing strategies for sequential circuits are slow-fast-slow strategy and at-speed strategy.

Slow-fast-slow testing strategy assumes that the vectors for initialization and propagation of the fault effect are applied at a slow speed. In such slow speeds up the circuit can be considered delay fault-free in these testing stages. See S. Devadas. Delay Test Generation for Synchronous Sequential Circuits. *Proc. of ITC*, pages 144–152, September 1989; P. Agrawal, V. D. Agrawal, and S. C. Seth.

Generating Tests for Delay Faults in Nonscan Circuits. Design &1 Test of Computers, pages 20–28, March 1993; and T. J. Chakraborty, V. D. Agrawal, and M. L. Bushnell. Delay Fault Models and Test Generation of Random Logic Sequential Circuits. Proc. of DAC, pages 453–457, June 1993. Activation of the fault in a slow-fast-slow strategy is performed by applying a fast clock. It should be noted that in the slow-fast-slow strategy, fast simply means that the clock during the activation stage is faster than that in the initialization and propagation stage. Such a fast clock, as discussed in subsequent sections related to at-speed strategies, does not operate at the speed of the circuit that is tested.

At-speed testing strategy assumes that the fault is initialized, activated and propagated under a fast clock. Unlike the fast clock in the slow-fast-slow, at-speed testing strategies have been proposed that assume that the inputs are applied and the outputs are observed at the rated speed of the circuits that are tested. See I. Pomeranz and S. M. Reddy. At-Speed Delay Testing of Synchronous Sequential Circuits. Proc. of DAC, pages 177–181, June 1992, K.-T. Cheng. Transition Fault Testing for Sequential Circuits. Trans. on CAD, 12(12):1971–1983, December 1993; and S. Bose, P. Agrawal, and V. D. Agrawal. A Rated-Clock Test Method for Path Delay Faults. Trans. on VLSI, 6(2):323–331, June 1998. However, the at-speed strategy mention above assumes that a high-speed tester is available. To differentiate between these at-speed testing strategies and the at-speed testing strategies that can be used to test fast designs on slower testers, the former is referred to herein as conventional at-speed testing strategies.

The present invention is specifically related to at-speed testing schemes for slow testers. The speed of the tester is assumed to be k times slower than the speed of the circuits to be tested on it. Herein, k is a positive integer. In such a case, an external or internal fast clock for operating the tested circuit is required. If a fast clock is not available on the tester, an internal fast clock can be generated using the tester's clock in combination with a phase lock loop or a frequency multiplier. FIG. 1 illustrates the concept of at-speed testing schemes for slower testers. As shown, the at-speed schemes for slow testers belong to two classes:

(1) testing schemes that apply vectors generated under the assumption that a high speed tester is available (i.e., test generation method is independent of the speed of the tester) and (2) testing schemes that require application of vectors generated for slow speed testers (i.e., constraints are placed on the test generation procedure to accommodate the speed difference between the designs and the tester).

FIG. 2 illustrates the classification of testing strategies. Case k=1 corresponds to a high speed tester while case k>1 corresponds to the case when the tested designs correspond to circuits that are faster than the tester. The doublet waveform method is a type of conventional at-speed testing scheme currently used in practice for testing sequential designs that are up to two times faster than the speed of the tester (i.e., k=2). See R. Huston. Digital Test Engineering: The Practice of Developing Test Programs for Automatic Test and Characterization of Digital Semiconductor Devices. ITC, Tutoral, November 1997. The doublet waveform method can be extended for k>2. However, it requires more complex tester timing resources and results in testers being more expensive.

Presently, limitations in the generation of tester timing prohibit the use of slow-fast-slow schemes for k>2. A key concept behind the slow-fast-slow schemes for k>1 is the application of more than one input vector during one tester cycle. The test sequence is the same as that applied in conventional at-speed schemes. These slow-fast-slow schemes for k>1 require that the test sequence be applied multiple times in one tester cycle; and at each application of the test vector, the responses of only a subset of fault patterns are measured. Compared to the conventional at-speed testing strategies, the slow-fast-slow schemes for k>1 have the same fault coverage but a longer test application time (because the test sequence needs to be applied multiple times).

Test generation for delay faults is closely tied to the test application strategy and to the delay fault model. Several conventional delay fault models have been proposed in the prior art:

transition model; See J. A. Waicukauski, E. Lindbloom, B. Rosen, and V. Iyengar. Transition Fault Simulation. Design & Test of Computers, pages 32–38, April 1987; M. H. Schulz and F. Brglez. Accelerated Transition Fault Simulation. Proc. of DA C, pages 237–243, June 1987; and K.-T. Cheng. Transition Fault Testing for Sequential Circuits. Trans. on CAD, 12(12) :1971–1983, December 1993, gate model; See K. D. Wagner. The Error Latency of Delay Faults in Combinational and Sequential Circuits. Proc. of ITC, pages 334–341, November 1985, and path delay fault model; See G. L. Smith. Model for Delay Faults Based upon Paths. Proc. of ITC, pages 342–349, November 1985.

In all the above-mentioned conventional delay fault models, the fault has to be propagated to a primary output through some path within the circuit. Paths in a sequential circuit can be divided into two categories:

(1) paths that originate at a primary input (PI) or present state line and end at a primary output (PO), and (2) paths that originate at a PI or present state line and end at a next state line.

Depending on the kind of path through which a delay fault can be propagated after its activation, delay faults can be divided into two categories:

(1) faults that can be propagated only through paths that end at some primary output (these are called PO-logic faults), and (2) faults that can be propagated through paths that end at a next state line ( these are called NS-logic faults).

IB.1 Slow-Fast-Slow Testing Scheme

If the slow-fast-slow testing scheme is used on a slow tester, the presence or absence of latches on primary outputs affects the testable set of faults. This is because to observe a fault, after activation, it has to be propagated to some primary output of the circuit. Consider, for example, testing of non-scan designs. The slow-fast-slow methodologies proposed in the prior art can be directly used to test high speed designs on low speed testers if the primary outputs are latched. See S. Devadas. Delay Test Generation for Synchronous Sequential Circuits. Proc. of ITC, pages 144–152, September 1989, P. Agrawal, V. D. Agrawal, and S. C. Seth. Generating Tests for Delay Faults in Nonscan Circuits. Design &1 Test of Computers, pages 20–28, March 1993 and T. J. Chakraborty, V. D. Agrawal, and M. L. Bushnell. Delay Fault Models and Test Generation of Random Logic Sequential Circuits. Proc. of DAC, pages 453–457, June 1993. The test application scheme for non-scan designs with latched PI/PO is shown in FIG. 3(a). The primary inputs can be latched, but it is not essential. The primary inputs are applied and the primary outputs are observed at the tester's speed. The tester's clock is also used in the slow stages (fault initialization and fault propagation). The tester's clock is assumed to be slow enough for the circuit to be fault-free in these stages. Fault activation is performed with a fast clock. Each vector applied to the circuit can be represented as pair $V=(I_i, S_j)$, where $I_i$ denotes the i-th set of primary inputs and $S_j$, denotes the j-th set of present state values.

Consider the waveform in FIG. 3(b). It illustrates the case when the tester's dock is two times slower than the operating speed of the circuit under test, i.e., k=2. Also, it is assumed that the test sequence for the target fault consists of two initialization vectors ($V_1$ and $V_2$), one activation vector ($V_3$) and two propagation vectors ($V_4$ and $V_5$). Initialization vectors, $V_1$ and $V_2$ are applied at times $T_1$ and $T_2$ respectively. It should be noted that initialization vector can be applied only at the tester's slow clock. After the application of the activation vector at time $T_3$, the values of the primary outputs and next states are latched at time $T_4$. Here, it should be noted that the activation vector is applied using the fast clock. Next, the propagation vectors $V_4$ and $V_5$ are applied at times $T_5$ and $T_6$, respectively. Again, the propagation vectors are applied only at the tester's slow clock. Finally, at time $T_7$, the primary outputs are observed.

Since the primary outputs can be latched at the end of the activation phase, the slow-fast-slow methodology can test both NS-logic and PO-logic faults. When the primary outputs are not latched, PO-logic faults might not be testable on a slow tester using slow-fast-slow testing scheme. Only faults that are larger than a certain size can be tested. For example, PO-logic faults in the circuit in FIG. 3(a) have to be larger than $T_5-T_4$ to be testable.

A comparison of classes of path delay faults that can be detected by slow-fast-slow and at-speed testing schemes for the case when a fast tester is available has been discussed in the prior art. See S. Majumder, V. D. Agrawal, and M. L. Bushnell. Path Delay Testing: Variable-Clock Versus RatedClock. *Proc. of Int'l Conf. on VLSI Design*, pages 470–475, January 1998. The results might not be valid for the case when the tester is slower than the tested designs (k>1).

IB.2 Conventional At-Speed Testing

In any at-speed testing scheme, the fault is assumed to be present in all test stages. Conventional at-speed testing schemes require that the primary inputs are applied and the primary outputs are observed at the circuit's rated speed. In this section, conventional strategies that allow using test vectors generated under conventional at-speed testing schemes are discussed.

In early testers, the pin electronics that are used to stimulate or observe the response of the tested device had central and shared timing resources. See R. Huston. Digital Test Engineering: The Practice of Developing Test Programs for Automatic Test and Characterization of Digital Semiconductor Devices. ITC, Tutorial, November 1997. As the demands for high tester timing accuracy were increasing, it was becoming clear that tester architectures with central and shared timing resources could not satisfy the edge accuracy requirements. This led to testers with the per-pin architecture. These testers allow for easier test program generation since each tester pin is provided with its own, independent timing resources. However, providing each tester pin with its own timing resources is the main cause of the testers being expensive. It is thus clear that more complex per-pin architectures leads to higher cost testers.

Generating input stimuli and strobing the outputs requires application of timing events or timing markers. The per-pin architecture testers provide separate timing markers for each tester pin. Also, there could be more than one timing marker available during one tester cycle. Testers commonly in use usually have four timing markers per tester cycle. More expensive testers might have five, six or more timing markers per cycle. Timing markers allow application of multiple input patterns in one tester cycle. The doublet waveform method that is currently used in practice is based on applying multiple input patterns in one tester cycle. See R. Huston. Digital Test Engineering: The Practice of Developing Test Programs for Automatic Test and Characterization of Digital Semiconductor Devices. ITC, Tutorial, November 1997. The doublet waveform method allows testing devices at frequencies that are up to two times higher than the maximum frequency of the tester. In such cases, it is assumed that a free running clock with frequency matching the design frequency of the tested circuit is available.

The doublet waveform method applies two input patterns to the tested circuit during one tester cycle. Generating two patterns per tester cycle requires two timing markers. FIG. 4 illustrates application of value 0 followed by value 1 during one tester cycle. Timing markers used for generating this input stimuli are denoted as $t_1$ and $t_2$. The outputs are usually observed using window strobing. In window strobing the output pin is monitored during an interval (or window) of time. Observing one output using window strobing requires two timing markers. If the tester has four timing markers available per tester cycle and two timing markers are used for generating the input stimuli in the doublet method, then only one window strobe can be performed in the same tester cycle. This means that the outputs in the doublet waveform method have to be observed in two phases. Therefore, the same set of inputs needs to be applied twice. FIG. 5 illustrates the two-phase output strobing. These phases are denoted as phase A and phase B. After the first application of the doublet pattern, the output is strobed in the interval between $t_1$ and $t_2$ (phase A). After the patterns are applied for the second time, the output is strobed in the interval between $t_2$ and the second $t_1$ (phase B).

The doublet waveform method applies two patterns per tester cycle. However, the test sequence needs to be applied twice. The test time can be significantly shortened if a tester has more than four timing markers. For example, on a tester with six timing markers per tester cycle, the observation of the outputs could be performed with only one application of the input pairs since the observation of outputs could be done in one phase. The doublet waveform method can also be generalized for application of more than two vectors per tester cycle. For example, if the tester has five timing markers per cycle, it is possible to test devices whose speed is up to three times higher than the speed of the tester. In each tester cycle, three timing markers would be used for input stimuli and the same patterns would be applied three times to observe the outputs in three different phases. However, the cost of the tester is directly proportional to the number of timing markers per tester cycle and the number of markers is also limited by the tester timing marker regeneration time.

In the above methods, the set of detected faults does not depend on the presence or absence of PO latches since the observation of the outputs can be done after each applied pattern, although in different phases.

The at-speed methods for testing circuits with speeds higher than the speed of the tester described in this subsection do not require any special test generation procedures.

It is therefore desirable to have a tester that can test circuits faster than the testers speed, but that does not incur the additional costs that are described above.

It should be noted that detailed descriptions of scan techniques, scanning algorithms and other related issues, which may be required for a general understanding of the subject matter described herein, can be found in co-pending U.S. application Ser. No. 08/994,430, by Chakradhar, et al, titled Peripheral Partitioning and Tree Decomposition for Partial Scan, which is incorporated herein by reference.

II. SUMMARY OF THE INVENTION

It is an object of the present invention to find ways to test fast designs on slower testers without all the above-mentioned problems that are seen in conventional testers.

It is a specific object of the present invention to provide a class of at-speed testing strategies to reduce the test application time for a slow tester testing a high speed circuit. It is another object of the present invention to provide a tester slower than the speed of the circuit which is tested that uses test vectors that integrates the speed limitations of the tester.

The present invention integrates the tester's speed limitation with the test generation procedure. Putting constraints on the set of inputs that can be applied to the circuit under test and how the outputs can be observed helps reduce the test application time. It should be noted that, due to the constraints placed on the test generation procedure, these strategies can result in a lower fault coverage.

To meet the objects of the present invention there is provided a method of generating test vectors for detecting faults in a system, said system operating at a system speed, wherein the system is tested using a tester, said tester operating at a tester speed, said tester speed being no more than the system speed, said method taking into account the tester speed by integrating speed limitations of the tester during a test vector generation process.

Preferably, the tester speed is substantially less than the system speed.

Preferably, the system to be tested is a VLSI circuit and the tester speed is no more than a speed of the VLSI circuit.

Another aspect of the present invention is a method of testing high-speed circuits using a tester, said circuits having a circuit speed, said tester having a tester speed, said tester speed being lower than the circuit speed, said testing being done by applying test vectors to the circuit, said test vectors being generated using a model of the circuit while taking into account the circuit design and the tester speed by integrating the speed limitations of the tester.

Yet another aspect of the present invention is a method of testing high-speed circuits using a tester said circuits having a circuit speed, said tester having a tester speed, said tester speed being lower than the circuit speed, said method comprising: estimating the tester speed; estimating the circuit speed; obtaining a model of a design of the circuit; generating test vectors using the model of the circuit by integrating the tester speed and the model of the circuit; applying test vectors generated in step d at the tester speed; and observing outputs generated by the circuit at the tester speed.

Preferably, between applying input vectors and observing outputs the circuit is allowed to run at the circuit speed.

Still another aspect of the present invention is a tester for testing high-speed circuits, said circuits having a circuit speed, said tester having a tester speed, said tester speed being no more than the circuit speed, said tester applying test vectors to the circuit, said test vectors being generated using a model of the circuit while taking into account the circuit design and the tester speed by integrating the speed limitations of the tester.

Preferably, the tester speed is substantially lower than the circuit speed.

III. LIST OF FIGURES

The above objectives and advantages of the present invention will become more apparent by describing in detail preferred embodiments thereof with reference to the attached drawings in which:

FIG. 7 shows at-speed testing scheme for k=3.

FIG. 8 shows a circuit model for test generation for k=2.

FIG. 9 shows a circuit model for test generation for k=3.

FIG. 11 shows a table with the results of simulation experiments using embodiments of the present invention.

IV. DETAILED DESCRIPTION OF THE PREFERRED EMBODIMENT

The conventional slow-fast-slow and the at-speed testing strategies of the present invention both have their advantages and limitations. For example, if a slow-fast-slow scheme is used on a slow tester and the primary outputs are not latched some faults will stay undetected. The at-speed strategies of the present invention might be able to detect them. In addition, using at-speed testing strategies of the present invention for faults that can be tested by either the slow-fast-slow or at-speed strategy can reduce the test application time. On the other hand, due to the presence of the fault in all test phases, the at-speed techniques might result in a lower fault coverage than the slow-fast-slow technique. Also, integrating the test generation procedure with the tester speed limitation can further reduce the fault coverage. However, it should be noted that a good fault coverage (though not complete fault coverage) at a lower cost is very desirable compared to complete fault coverage at exorbitant costs.

Figure 1:
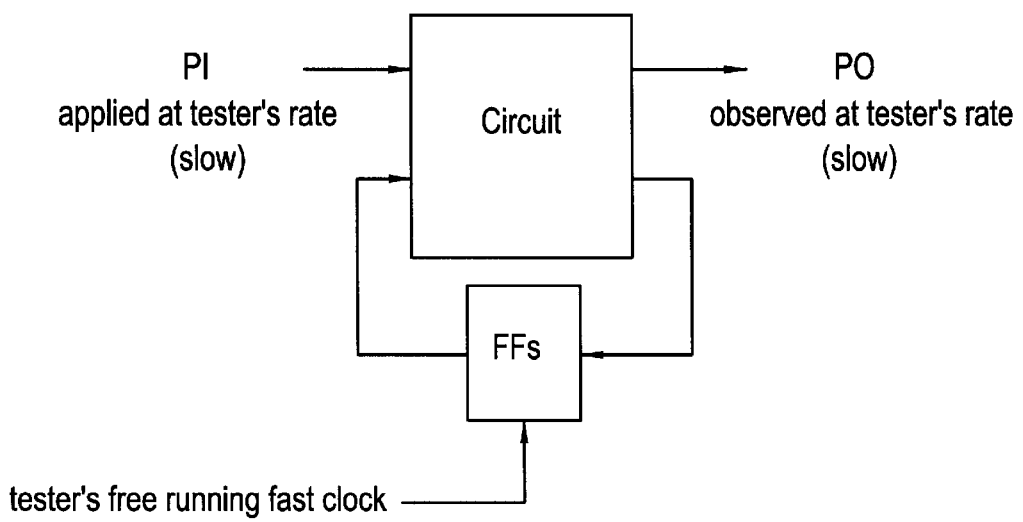
FIG. 1 shows a schematic for at-speed testing strategies for slow testers.
Figure 2:
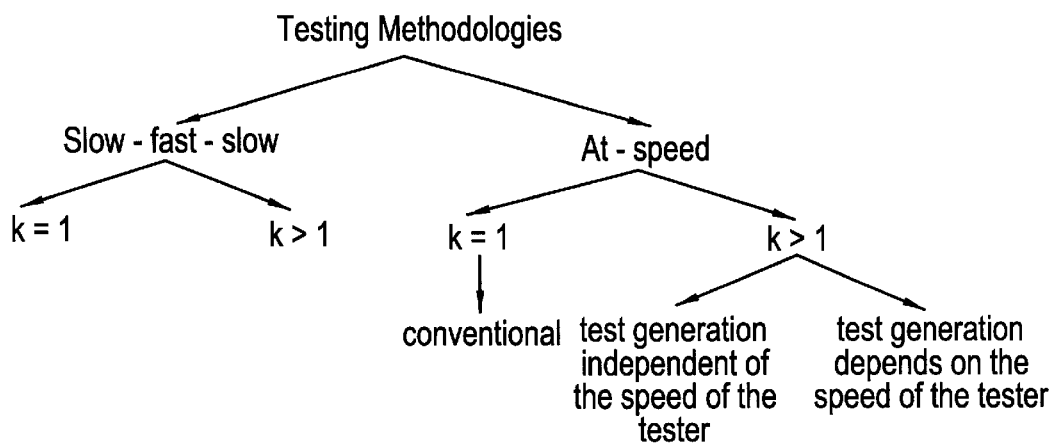
FIG. 2 shows the classification of different testing strategies.
Figure 3:
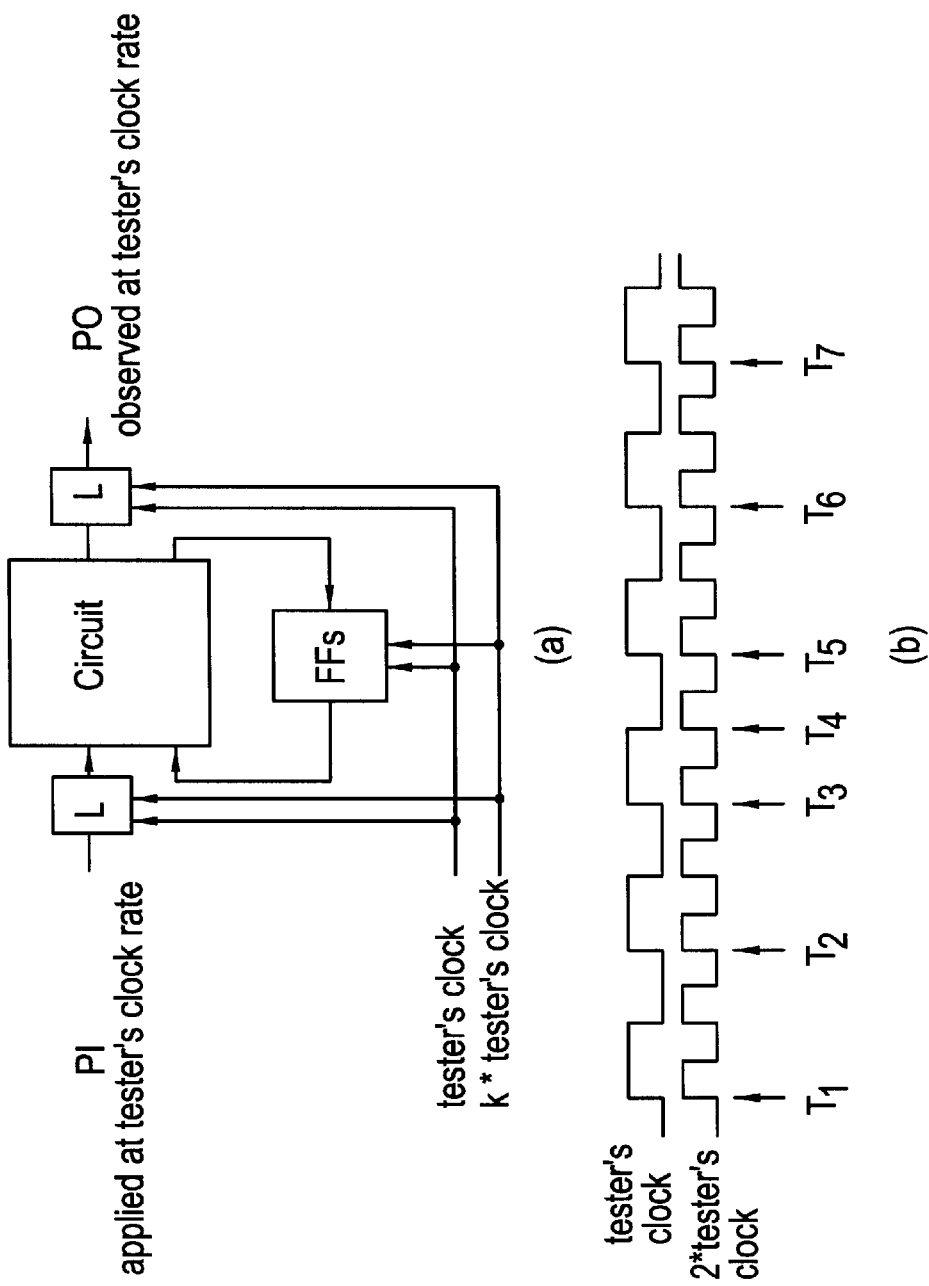
FIG. 3 shows non-scan designs with latched PI/PO.
Figure 4:
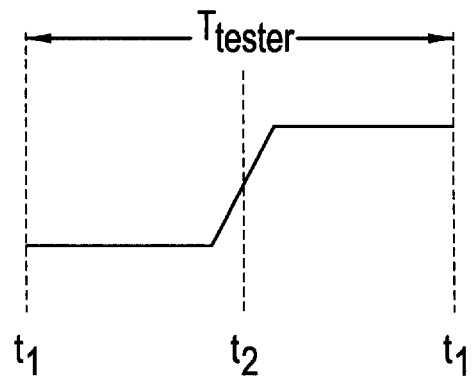
FIG. 4 shows a doublet waveform for pattern 01.
Figure 5:
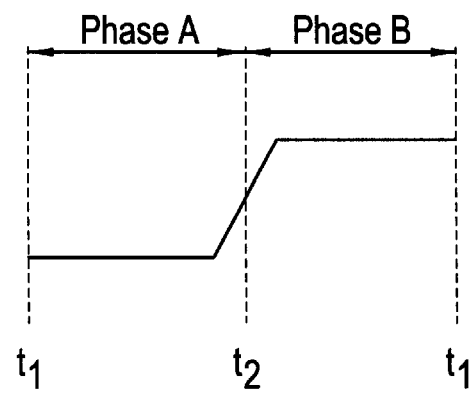
FIG. 5 shows a two phase output strobe.
Figure 6:
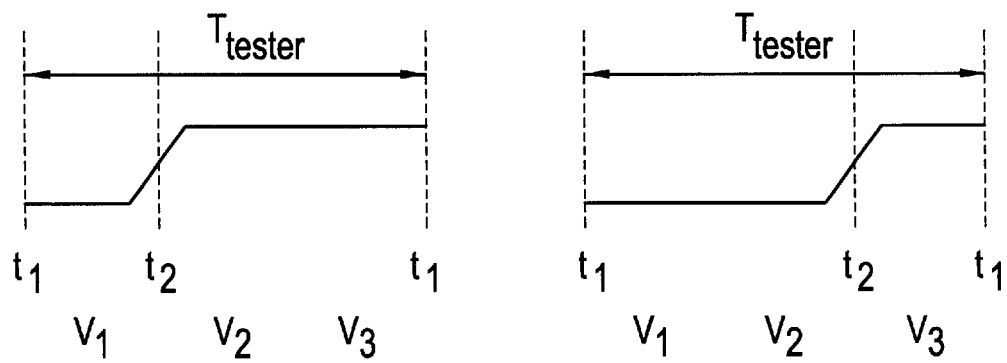
FIG. 6 shows the application of three patterns with two timing markers.
Figure 10:
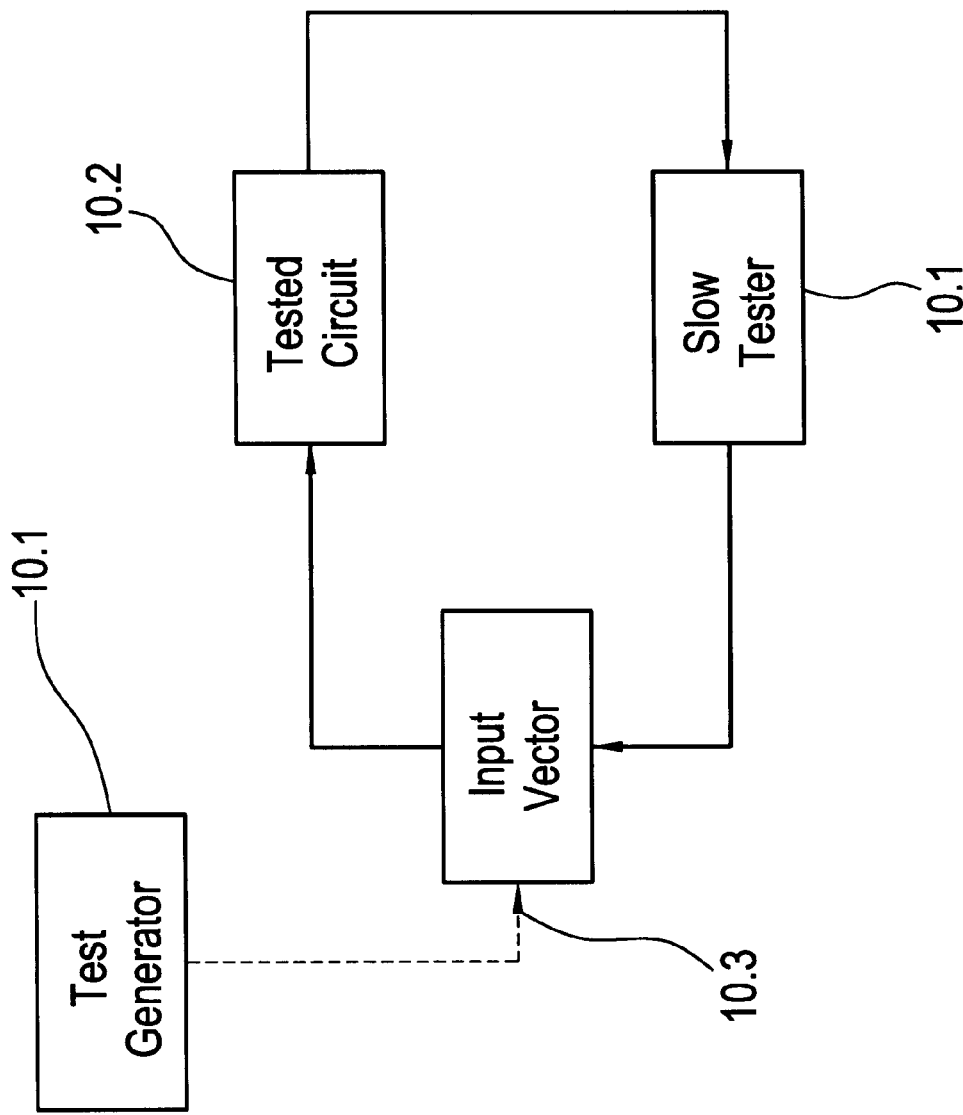
FIG. 10 shows a block diagram of a preferred embodiment of the system according to the present invention.

The preferred embodiment of the present invention is a tester that tests VLSI circuits that operate at a speed higher than the speed of the tester. This preferred embodiment is shown in FIG. 10. A tester 10.1 operates at a speed lower than the VLSI circuit 10.2. The VLSI circuit 10.2 might exhibit faulty behavior in response to input vectors 10.3 applied to the circuit. According to the present invention to input vectors 10.3 are generated in the test generator 10.4 using a model of the circuit by integrating the speed limits of the tester 10.1. The VLSI circuit 10.2 operates at a speed k times that of the speed of the tester 10.1. The input vectors 10.3 also depend on the specific design of the VLSI circuit 10.2.

FIGS. 6–9 and the accompanying description describe in detail various examples of operation of the tester with different values of k. They also describe issues involved in the generation of the test vectors under the described scenario. It should be noted that the present invention is not limited to any particular way of generating test vectors. As long as the speed limitations of the tester are taken into consideration any method of generating test vectors can be used. While the conventional technologies focused on improving the speed of the tester, the present invention focuses on generating test vectors taking into account the speed limitations of the tester. It should also be noted that for a specific circuit, a particular way of generating test vector, while integrating the speed limitations of the tester, might be more preferable to another way of generating test vector. All the different ways of generating test vectors for any specific circuit is within the scope of this invention so long as the speed limitations of the tester are taken into account.

The slow-fast-slow and at-speed methodologies of the present invention can also complement each other and combining them might help increase the overall fault coverage and reduce the test application time.

In an embodiment of the present invention, multiple input vectors are applied in one tester cycle. In such a case, the test vector is generated such that the observation of the outputs are fixed for a given phase for each output pin. For example, using the conventional doublet waveform method and two phases A and B, the test vectors are generated according to the present invention such that the detection of the fault for a given output is always in phase A. For some other output, the detection for all input vector pairs are in phase B. This eliminates the need for applying the input vectors twice while also reducing the test time. It should be noted that, the test generation process would be more complicated and the fault coverage might be reduced. However, this enables using a slow tester while preventing the escalating cost of the tester.

The idea of integrating the test generation with the tester's speed and using a number of available timing markers can also be used to test devices that are more than two times faster than the tester. For example, assume that the tester has four timing markers per cycle. As noted earlier, two timing markers are required for window strobing. If three input patterns need to be applied in one cycle with two timing markers, the tester clock cycle can be divided as illustrated in FIG. 6(a) or FIG. 6(b). In the first case, the timing marker $t_2$ is applied at time equal to ⅓ of the tester's clock cycle. In the second case, $t_2$ is applied at time equal to ⅔ of the tester's clock cycle. This pattern application scheme puts constraints on the test generation process. It should be apparent to a skilled artisan that, in this example, input patterns 010 and 101 are not allowed. The described input application scheme can further be combined with different output observation schemes. For example, the outputs can be observed by applying the same set of patterns three times. In such a case, the constraints on the test generation process come only from the application of input stimuli. The outputs can also be observed by applying the input patterns only twice or just once. In such a case, the test generation process would have limitations both from the input application and output observation. The methods of the present invention are applicable to testers that have at least four timing markers per tester cycle. Due to high cost of testers with a large number of timing markers per tester cycle and the limitations on the feasible number of timing markers these schemes are limited to testing designs that are 2 times faster than the tester.

To avoid the high cost of testers with large number of timing markers or to test designs that are more than two times faster than the tester, an aspect of the present invention is the provision of the following scheme. It is assumed that the PIs/POs can be applied/observed only at the tester's rate. However, between the application of inputs and observation of outputs, the circuit is allowed to run at the speed of the circuit. FIG. 7(a) shows an embodiment of the present invention that illustrates an at-speed testing scheme of the present invention for k=3. The same set of primary input values is applied for three fast clock cycles and the primary outputs are only observed after the third cycle. The delay elements are clocked with the fast clock and the circuit passes through three different states before the application of the next set of primary inputs. Since the observation of the outputs is performed at the testers speed, the existence or non-existence of latches at the primary outputs does not affect which faults can be tested using this at-speed scheme. The described at-speed testing scheme can be applied to non-scan, scan and partial scan designs.

For example, let the design in FIG. 7(a) be a non-scan design and consider the waveform shown in FIG. 7(b). At time $T_1$, vector $V_1=(I_1, S_1)$ is applied to the circuit. Next, at time $T_2$ the primary input values stay unchanged but the state values have changed. Therefore, at time $T_2$, vector $V_2=(I_1, S_2)$ is applied to the circuit. Similarly, at time $T_3$, vector $V_3=(I_1, S_3)$ is applied. Finally, at time $T_4$, the primary outputs can be observed. A new vector, $V_4=(1_2, S_4)$, is applied to the circuit at time $T_4$ and the cycle repeats. In this scheme, if the test sequence contains n test vectors, where n is a positive integer, the circuit actually changes m×n states, where m=1, 2. For example, the circuit in FIG. 7(a) must go through 3 or 6 or 9, . . . states. Therefore, the test generation process for the at-speed testing strategy of the present invention is different from the test generation process for conventional at-speed schemes.

Next, assume that the design in FIG. 7(a) is a scan design and consider the waveform shown in FIG. 7(b). The application of primary inputs, scan-in, scan-out and observation of the primary output values are performed at the speed of the tester. However, between the scan-in and scan-out operations, the circuit is allowed to run at the speed of the fast clock and it goes through three states while the primary inputs are kept constant. At time $T_1$, the first set of state values, $S_1$, is assumed to be already scanned-in and $I_1$, is applied at the primary inputs. The state values for the second and third vector, $V_2=(I_1, S_2)$ and $V_3=(I_1, S_3)$, are obtained through functional justification and these vectors are applied at times $T_2$ and $T_3$, respectively. At time $T_4$, the values of the primary outputs are observed and the scan-out operation starts. Testing strategy for partial scan designs can be described as a combination of testing strategies for scan and non-scan designs, depending on the target fault.

In general, the at-speed schemes of the present invention described in this subsection may lead to reduced fault coverage compared to the fault coverage obtained by conventional at-speed testing. This is because the constraints placed on the allowed input patterns can negatively affect the controllability of the design. Also, limiting the observation of the outputs to one only one phase for each pin might reduce the observability of the designs. However, the described at-speed techniques can be combined with the slow-fast-slow testing strategy to obtain higher overall fault coverage. In the case when there are no latches on the primary outputs, the at-speed technique can be used to test PO-logic faults that would otherwise stay untestable using the conventional slow-fast-slow strategy. In addition, some NS-logic faults are also be untestable by a slow-fast-slow scheme but testable by the at-speed scheme of the present invention. The at-speed schemes of the present invention can be used to detect them as well. All of the described at-speed testing strategies can be used with any delay fault model (transition, gate, and path). The next subsection describes several embodiments of the present invention and the results of several simulation experiments using transition fault model on benchmark circuits.

IV.A Further Examples and Results of Experiments with Transition Faults

The fault coverage of at-speed strategies of the present invention for slow testers to the fault coverage of the conventional at-speed testing scheme for transition faults. See K.-T. Cheng. Transition Fault Testing for Sequential Circuits. *Trans. on CAD*, 12(12):1971–1983, December 1993. A conventional at-speed strategy for testing transition faults in sequential circuits was proposed in the above paper. Transition delay fault model is used for detecting large delay defects concentrated at gate inputs or outputs. See J. A. Waicukauski, E. Lindbloom, B. Rosen, and V. Iyengar. Transition Fault Simulation. *Design & Test of Computers*, pages 32–38, April 1987; M. H. Schulz and F. Brglez. Accelerated Transition Fault Simulation. Proc. of DA C, pages 237–243, June 1987; and K.-T. Cheng. Transition Fault Testing for Sequential Circuits. *Trans. on CAD*, 12(12):1971–1983, December 1993. The transition faults are characterized by the fault site, type and size. See K.-T. Cheng. Transition Fault Testing for Sequential Circuits. *Trans. on CAD*, 12(12):1971–1983, December 1993. The fault type is either slow-to-fall or slow-to-rise transition. The fault size is given as a number of clock cycles.

In the BACK stuck-at-fault test generator and the PROOFS parallel, differential fault simulation algorithm for stuck-at faults have been modified to accommodate testing transition faults. See K.-T. Cheng. Transition Fault Testing for Sequential Circuits. *Trans. on CAD*, 12(12):1971–1983, December 1993; W.-T. Cheng. The BACK Algorithm for Sequential Test Generation. *Proc. of ICCD*, pages 66–69, October 1988; and T. M. Niermann, W.-T. Cheng, and J. H. Patel. PROOFS: A Fast, Memory-Efficient Sequential Circuit Fault Simulator. *Trans. on CAD*, 11(2):198–207, February 1992. The BACK (test generation) and PROOFS (fault simulation) algorithms process the sequential circuit timeframe by time-frame. These algorithms are modified by the test generation and fault simulation methods for transition faults under the at-speed schemes of the present invention. See K.-T. Cheng. Transition Fault Testing for Sequential Circuits. *Trans. on CAD*, 12(12):1971–1983, December 1993.

Applying doublet waveform method would result in the same fault coverage as the conventional at-speed testing. However, the test time of the doublet method is longer than the time for conventional at-speed testing since the patterns have to be applied twice. The present experiments are related to evaluating the fault coverage of the doublet waveform method in which the patterns are applied only once and the outputs are observed in one phase only. This can result in a shorter test application time. Test vectors are generated for a circuit model shown in FIG. 8. Two different input patterns are applied in one tester cycle but the outputs are observed only after each even vector. Note that this test generation scheme does not explore the possibility of observing different outputs in different phases (odd or even). All outputs are observed after each even vector. For case k=3, it is assumed that a tester has only four timing markers. Only two timing markers can be used for input application. The circuit models shown in FIGS. 9(a) and (b) are used to apply three patterns per cycle. For both experiments, the observation of all outputs is done only after the third fast clock.

Table 1 shown in FIG. 11 shows the results of these experiments. The experiments were performed for transition faults of size equal to one clock cycle. The table shows the fault coverage and the number of vectors for k=1, k=2 and k=3 for some partially scanned ISCAS89/ADDENDUM93 benchmark circuits. The cycle breaking method is used to obtain the partial scan circuits. See K.-T. Cheng and V. D. Agrawal. A Partial Scan Method for Sequential Circuits with Feedback. *Trans. on CAD*, 39(4):544–548, April 1990. For case k=2, under the test generation scheme of the present invention, the number of vectors is comparable or larger than twice the number of vectors generated under the conventional at-speed scheme (k=1). Therefore, with respect to these vectors, the doublet method that applies the inputs twice and observes the outputs in both phases is a better solution since it leads to higher fault coverage (fault coverage would be the same as the one shown for k=1). A test generation process that explores the possibility of observing different outputs at different phases might lead to shorter test sequences. For k=3, the solution of applying the input patterns three times in order to observe the outputs in three different phases is not possible on most testers commonly in use (it would require five timing markers). Therefore, for k=3 the strategies used in the present experiments could be the only solutions. The column k=3 reports the fault coverage for the two sets of vectors generated in experiments for models in FIGS. 9(a) and (b). The number of vectors is found as a sum of the vectors in these two sets.

Combining slow-fast-slow and at-speed testing schemes for slow testers could result in higher fault coverages and reduced test application times.

IV.B Conclusions

The present invention considers at-speed techniques for testing high speed VLSI circuits on slow testers. This problem is of great practical importance because the speed of the testers usually lags behind the speed of the new designs. Conventional at-speed testing strategies cannot be used to test fast designs on slow testers. The at-speed scheme of the present invention takes into account the slow speed of the tester. Some embodiments have been tested on transition faults. To increase the fault coverage and reduce the test application time, combining at-speed strategies with slow-fast-slow schemes is a viable option.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of testing high-speed circuits using a tester said circuits having a circuit speed, said tester having a tester speed, said tester speed being lower than the circuit speed, said method comprising:
   a) estimating the tester speed;
   b) estimating the circuit speed;
   c) obtaining a model of a design of the circuit;
   d) generating test vectors using the model in step c, by integrating the tester speed obtained in step a and the model of the circuit obtained in step b;
   e) applying test vectors generated in step d at the tester speed; and
   f) observing outputs generated by the circuit at the tester speed.

2. The method of claim 1 wherein between applying input vectors and observing outputs the circuit is allowed to run at the circuit speed.

3. A method of generating test vectors for detecting faults in a system:

determining a system speed of the system;

determining a tester speed of a tester for testing the system, wherein the tester speed is no more than the system speed;

assessing speed limitations of the tester; and generating test vectors for performing testing such that the speed limitations of the tester are taken into account during the generation of the test vectors.

4. The method of claim 3 wherein said tester speed is substantially less than the system speed.

5. The method of claim 3 wherein the system to be tested is a VLSI circuit and the tester speed is no more than a speed of the VLSI circuit.

6. A testing system for testing a high-speed circuit, comprising:

a tester having a tester speed, said tester speed being no more than the circuit speed, a set of test vectors;

said tester being adapted to apply test vectors to the circuit, said test vectors being generated using a model of the circuit while taking into account the circuit design and the tester speed by integrating the speed limitations of the tester.

7. The testing system of claim 6 wherein the tester speed is substantially lower than the circuit speed.

* * * * *